United States Patent [19]

Kurosaka et al.

[11] Patent Number: 5,949,691
[45] Date of Patent: Sep. 7, 1999

[54] LOGIC CIRCUIT VERIFICATION DEVICE TO VERIFY THE LOGIC CIRCUIT EQUIVALENCE AND A METHOD THEREFOR

[75] Inventors: Hitoshi Kurosaka; Hideyuki Emura; Naotaka Maeda, all of Tokyo, Japan

[73] Assignee: NEC Corporation, Tokyo, Japan

[21] Appl. No.: 08/911,060

[22] Filed: Aug. 14, 1997

[30] Foreign Application Priority Data

Aug. 15, 1996 [JP] Japan .................................. 8-233576

[51] Int. Cl.[6] .................................................. G06F 17/50
[52] U.S. Cl. .................................... 364/489; 364/488
[58] Field of Search ............................ 364/488, 489, 364/490

[56] References Cited

U.S. PATENT DOCUMENTS

| | | | |
|---|---|---|---|
| 5,243,538 | 9/1993 | Okuzawa et al. | 364/489 |
| 5,301,318 | 4/1994 | Mittal | 364/489 |
| 5,497,334 | 3/1996 | Russell et al. | 364/489 |
| 5,671,399 | 9/1997 | Meier | 364/489 |
| 5,754,454 | 5/1998 | Pixley et al. | 364/491 |
| 5,867,395 | 2/1999 | Watkins et al. | 364/488 |
| 5,867,396 | 2/1999 | Parlour | 364/489 |

FOREIGN PATENT DOCUMENTS

| | | |
|---|---|---|
| 62-217172 | 9/1987 | Japan . |
| 63-226770 | 9/1988 | Japan . |
| 5-342301 | 12/1993 | Japan . |
| 6-162129 | 6/1994 | Japan . |
| 8-22485 | 1/1996 | Japan . |

OTHER PUBLICATIONS

Wolfgang Kunz et al., "A Novel Framework for Logic Verification in a Synthesis Environment", IEEE Transactions on Computer–Aided Design of Intergrat ed Circuits and Systems, vol. 15 No. 1, Jan. (1996), pp. 1–7.

A. Mukaiyama et al., "Logic Verification System: Condor", NEC Corporation, Jul. (1992), pp. 17–22.

*Primary Examiner*—Vincent N. Trans
*Attorney, Agent, or Firm*—Foley & Lardner

[57] ABSTRACT

A logic circuit verification device comprising a data input section to read the circuit data and the circuit information of the logic circuits to be verified and converts them into the intermediate format, a corresponding point detection section to extract and output the information about the corresponding points using the corresponding point detection algorithm, a circuit partitioning section to read the intermediate format data and partition the logic circuits according to the corresponding point information obtained by the corresponding point detection section so as to prepare circuit data of the subcircuits and a equivalence checking section to read the circuit data of the subcircuits, determine the subcircuits to be compared with referring to the corresponding point information obtained by the corresponding point detection section and comparatively compares the circuit data of the subcircuits.

11 Claims, 11 Drawing Sheets

LOGIC CIRCUIT VERIFICATION DEVICE TO VERIFY THE LOGIC CIRCUIT EQUIVALENCE AND A METHOD THEREFOR

BACKGROUNDS OF THE INVENTION

1. Field of the Invention

The present invention relates to a logic circuit verification device to verify the logic circuit equivalence and a method for such verification, and particularly relates to a logic circuit verification device to verify the equivalence with partitioning the logic circuits to be verified into subcircuits and a method therefor.

2. Description of the Related Art

In conventional circuit designing, the equivalence of two circuits has been verified by partitioning the two circuits to be verified into subcircuits and verifying the equivalence for each subcircuit. Circuits have been partitioned with focusing the registers first, and then with making use of intermediate signal name information. The compared subcircuits are associated according to the register signal name information and intermediate signal name information so that the equivalence is verified for each corresponding set of subcircuits.

For a conventional equivalence checking device used for circuit equivalence verification of this type and a method therefor, the user has to specify the register signal name information and intermediate signal name information to be used in the circuit partitioning as described above. This type of conventional technologies include, for example, a system disclosed in the literature "Logic Verification System: CONDOR" (Mukoyama et al., Design Automation Research Association 63-3, pp. 17–22, Information Processing Society of Japan). FIG. 10 shows the system configuration according to the conventional technology as described in the literature above.

As shown in FIG. 10, a conventional system described in the above literature inputs the circuit description of the circuits to be verified at a combinational circuit making section 1002 and creates subcircuits by partitioning the circuits to be verified according to the register signal name information obtained from the specification description. At a logic verification section 1001, it further partitions, when necessary, the subcircuits prepared by the combinational circuit making section 1002 according to the intermediate signal name information obtained from the specification description and collates the subcircuits one by one.

Other similar conventional technologies include the invention disclosed in Japanese Patent Application Laid-open (Kokai) No. Heisei 6-162129 "Logic circuit Verification Device". This invention discloses the device which partitions the verified circuits to make the subcircuits where the signal as which the signal name is the same is the output signal between two verified circuits and the primary input or the signal to which the verification result is corresponding is an input signal when partitioning the verified circuits.

Another example of conventional technologies is the one disclosed in the literature "A Novel Framework for Logic Verification in a Synthesis Environment" (Wolfgang Kunz, Member, IEEE, Dhiraj K. Pradhan, Fellow, IEEE, and Subodh M. Reddy, IEEE TRANSACTIONS ON COMPUTER-AIDED DESIGN OF INTEGRATED CIRCUITS AND SYSTEMS, VOL. 15, NO. 1, JANUARY 1996). This literature describes the technology which, on the assumption that the verified circuits are combinational ones, partitions the verified circuits into subcircuits and collates the subcircuits.

According to the conventional technology described in the literature "Logic Verification System: CONDOR" above, however, collation is made for each subcircuit prepared by partitioning the circuits at the combinational circuit making section and the logic collation section without any rule to choose the subcircuits to be compared, or a rule for correspondence of subcircuits to be compared. Besides, conventional technologies do not account for the configuration of the verified circuits and correspondence of the compared subcircuits should be specified manually, which results in a drawback of much labor.

In addition, the partitioning position of the verified circuit is decided by the agreement of the signal name according to the conventional technology as described in the above literature. Therefore, when the signal name of a suitable correspondence point for partitioning is different, the circuits cannot be divided with the correspondence concerned point. The conventional technology has the fault by which an appropriate partial circuit cannot be made in the above case.

Further, the conventional technology described in the literature "A Novel Framework for Logic Verification in a Synthesis Environment" assumes that the verified circuits are combinational ones, and cannot be applied to verification of sequential circuits.

SUMMARY OF THE INVENTION

An object of the present invention is to provide a logic circuit verification device which reduces the manhour of the user's work for efficient logic verification by automatically specifying the subcircuits to be compared and a method therefor.

Another object of the present invention is to provide a logic circuit verification device capable of logic verification with automatically specifying the subcircuits to be compared even when the circuits to be compared have different register names or when sequential circuits are to be verified and a method therefor.

According to the first aspect of the invention, a logic circuit verification device for partitioning of logic circuits into subcircuits and equivalence checking of such subcircuits, comprises conversion means for reading circuit data and circuit information of the logic circuits to be verified and converting the circuit data of the logic circuits into an intermediate format independent from technology, corresponding point detection means for reading the intermediate format data converted by the conversion means and extracting the information concerning the corresponding points, which are the positions for partitioning the logic circuits to be verified into subcircuits and for associating the subcircuits to be compared using one or more corresponding point detection algorithm prepared according to the type and configuration of the verified logic circuits and to output such extracted data as the corresponding point information, circuit partitioning means for reading the intermediate format data converted by the conversion means and, according to the corresponding point information obtained by the corresponding point detection means, partitioning the logic circuits to prepare the circuit data of the subcircuits, and equivalence checking means for reading the circuit data of the subcircuits prepared by the circuit partitioning means, and determining the subcircuits to be compared with referring to the corresponding point information obtained by the corresponding point detection means and comparatively verifying the circuit data of the subcircuits.

The corresponding point detection means obtains the corresponding point information using a rule to consider the points with the same signal name or logic name to be corresponding points or another rule to retrieve corresponding points under certain scheme when the signal names or logic names are different as required.

In the preferred construction, the user arbitrarily specifies the corresponding point detection algorithm to be used by the corresponding point detection means depending on the type and configuration of the logic circuits to be verified for individual logic circuit verifications.

In the preferred construction, the corresponding point detection means records at least the information concerning the output terminal serving as the terminal in circuit partitioning, the information concerning the input terminal set corresponding to the output terminal, and the information to specify the compared output terminal in the corresponding point information storage means of the other circuit to be compared with the output terminal to the file of the corresponding point information and the equivalence checking means records the equivalence checking result to the file of the corresponding point information corresponding to the equivalence checking result.

In the preferred construction, the corresponding point detection means executing, retrieval of logic nodes in the output direction for the primary input of the circuit to be verified from the primary input when there is no corresponding point information about the circuit data of the logic circuit to be verified and, when there already exists corresponding point information about the circuit data of the logic circuit to be verified, retrieval of logic nodes in the output direction for the primary input of the circuit to be verified and those judged to have the same equivalence checking result among the output terminals contained in the corresponding point information from the primary input and the output terminal recorded in the corresponding point information and, when several input terminals or a register are reached in the retrieval, retrieval of the primary input or the output terminal recorded in the corresponding point information in the input direction from the output terminal of the reached logic node, and detection of the parts in the circuit data having the same combination of the primary input and the output terminal recorded in the corresponding point information for the same output terminal of the logic node among the circuit data of all circuits to be verified based on the results of above retrievals, and the circuit partitioning means preparing circuit data of the subcircuits by partitioning parts of the circuit data detected by the corresponding point detection means from other parts.

According to the second aspect of the invention, a logic circuit verification method containing the following steps executed in a logic circuit verification device for partitioning of logic circuits into subcircuits and equivalence checking of such subcircuits, comprising the steps of:

a step of reading the circuit data and circuit information of the logic circuits to be verified and converting the circuit data of the logic circuits into an intermediate format independent from technology, a step of reading the intermediate format data converted by the conversion step and extracting the information concerning the corresponding points, which are the positions for partitioning the logic circuits to be verified into subcircuits and for associating the subcircuits to be compared using one or more corresponding point detection algorithm prepared according to the type and configuration of the verified logic circuits and to output such extracted data as the corresponding point information, a step of reading the intermediate format data converted by the conversion step and, according to the corresponding point information obtained by the corresponding point detection step, partitioning the logic circuits to prepare the circuit data of the subcircuits, and a step of reading the circuit data of the subcircuits prepared by the circuit partitioning step, determining the subcircuits to be compared with referring to the corresponding point information obtained by the corresponding point detection step and comparatively verifying the circuit data of the subcircuits.

The corresponding point detection step may further comprise a step of extracting the corresponding point information using a rule to consider the points with the same signal name or logic name to be corresponding points or another rule to retrieve corresponding points under certain scheme when the signal names or logic names are different as required;

a step of recording the extracted corresponding point information to a certain file; and a step of judging whether all of the rules have been used for retrieval of corresponding points and, if any of the rules has not been used yet, returning the processing to the corresponding point information extraction step.

The corresponding point detection step may further comprise a step of retrieving logic nodes in the output direction for the primary input of the circuit to be verified from the primary input when there is no corresponding point information about the circuit data of the logic circuit to be verified and retrieving, when there already exists corresponding point information about the circuit data of the logic circuit to be verified, logic nodes in the output direction for the primary input of the circuit to be verified and those judged to have the same equivalence checking result among the output terminals contained in the corresponding point information from the primary input and the output terminal recorded in the corresponding point information;

a step of retrieving, when several input terminals or a register are reached in the retrieval, the primary input or the output terminal recorded in the corresponding point information in the input direction from the output terminal of the reached logic node; and a step of detecting the parts in the circuit data having the same combination of the primary input and the output terminal recorded in the corresponding point information for the same output terminal of the logic node among the circuit data of all circuits to be verified based on the results of above retrievals;

wherein the circuit partitioning step preparing circuit data of the subcircuits by partitioning parts of the circuit data detected by the corresponding point detection means from other parts.

According to another aspect of the invention, a computer readable memory storing a control program to control a logic circuit verification device for partitioning of logic circuits into subcircuits and equivalence checking of such subcircuits, the control program comprising:

- a step of reading the circuit data and circuit information of the logic circuits to be verified and converting the circuit data of the logic circuits into an intermediate format independent from technology;

- a step of reading the intermediate format data converted by the conversion step and extracting the information concerning the corresponding points, which are the positions for partitioning the logic circuits to be verified into subcircuits and for associating the subcircuits to be compared using one or more corresponding point detection algorithm prepared according to the type and configuration of the verified logic circuits and to output such extracted data as the corresponding point information;

- a step of reading the intermediate format data converted by the conversion step and, according to the corresponding point information obtained by the corresponding point detection step, partitioning the logic circuits to prepare the circuit data of the subcircuits; and

- a step of reading the circuit data of the subcircuits prepared by the circuit partitioning step, determining the subcircuits to be compared with referring to the corresponding point information obtained by the corresponding point detection step and comparatively verifying the circuit data of the subcircuits.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
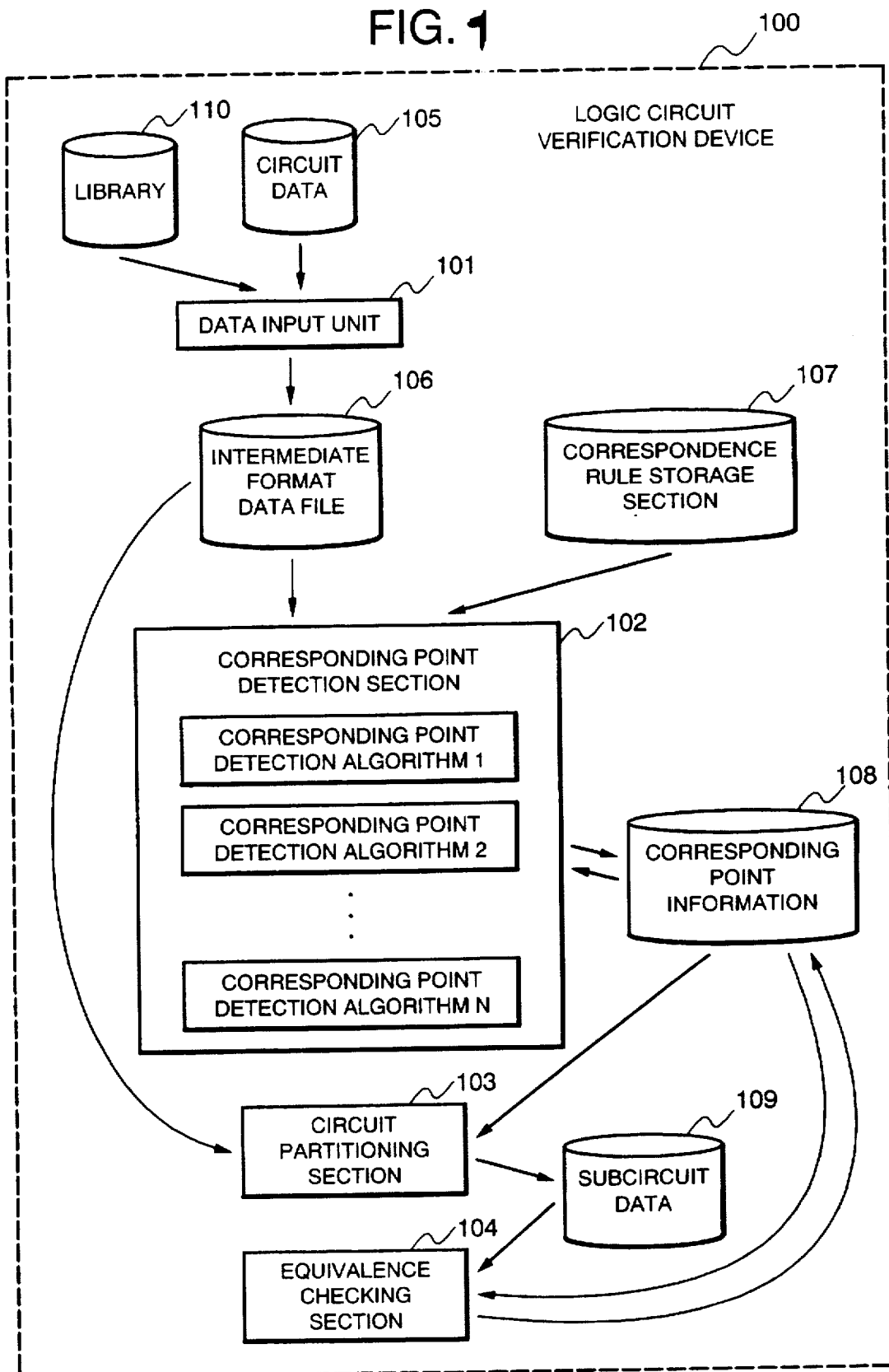
FIG. 1 is a block diagram to show the configuration of a logic circuit verification device according to an embodiment of the present invention.

FIG. 1 is a block diagram to show the configuration of a logic circuit verification device according to an embodiment of the present invention.

In the figure, a logic circuit verification device 100 according to this embodiment comprises a data input section 101 which inputs the circuit data of the circuits to be verified and converts such data into an intermediate format independent of the technology, a corresponding point detection section 102 which detects the corresponding points in the circuits to be verified, a circuit partitioning section 103 which, referring to the detection results of the corresponding point detection section 102, partitions the circuits to be verified so as to prepare subcircuits, a equivalence checking section 104 which collates the subcircuits prepared by the circuit partitioning section 103 one by one, and a correspondence rule storage section 107 which stores the correspondence rules used for detection of the corresponding points by the corresponding point detection section 102. Note that FIG. 1 shows characteristic elements in this embodiment only and omits other general elements of the configuration.

In the above configuration, the data input section 101, the corresponding point detection section 102, the circuit partitioning section 103 and the equivalence checking section 104 are achieved by the CPU and a RAM or other internal memories under control of the computer program. The correspondence rule storage section 107 is realized by a magnetic disk device or other external storage or a semiconductor memory. The computer program (control program) to control the CPU is provided as data stored in magnetic disks, semiconductor memories or other storage media and loaded to the internal memory, and controls the CPU to realize the above function performing sections.

The data input section 101 reads data from circuit data 105 and a library 110, converts them into a data file 106 in the intermediate format and outputs them to the corresponding point detection section 102 and the circuit partitioning section 103. The circuit data 105 here describes the circuits to be verified in VHDL (IEEE1076), Verilog-HDL (IEEE1364) or other hardware description languages or EDIF or other net lists. The library 110 contains the data describing the macro logic information used in the circuit data 105 in hardware description languages or net lists as above. In the conversion process by the data input section 101, the parts using the library 110 in the circuit data 105 are replaced with the applicable logic information read from the library 110. The data file 106 in the intermediate format prepared by the data input section 101 is provided with a format independent from any technology to store detailed circuit information.

The corresponding point detection section 102 stores the corresponding point detection algorithms 1 to N used for corresponding point detection. It reads the data file 106 in the intermediate format and, using an appropriate one of the corresponding point detection algorithms 1 to N, detects the corresponding points in the two circuits to be verified and prepares corresponding point information 108. When the applied corresponding point detection algorithm uses certain rules to find the corresponding points, necessary correspondence rules are read from the corresponding rule storage section 107. The corresponding point means here the point on which verification is executed for circuit comparison and specifically refers to an primary output of the compared circuit or an output terminal in the circuit. The contents and the number of the corresponding point detection algorithms 1 to N stored in the corresponding point detection section 102 may be determined properly corresponding to the type or configuration of the circuits to be verified. Replacement of the individual corresponding point detection algorithms 1 to N or selection to use or not to use certain algorithms among the stored corresponding point detection algorithms 1 to N may be freely executed corresponding to the type and configuration of the circuits to be verified. The corresponding point detection algorithms 1 to N are stored as the programs like subroutines in the corresponding point detection section 102.

Figure 3:
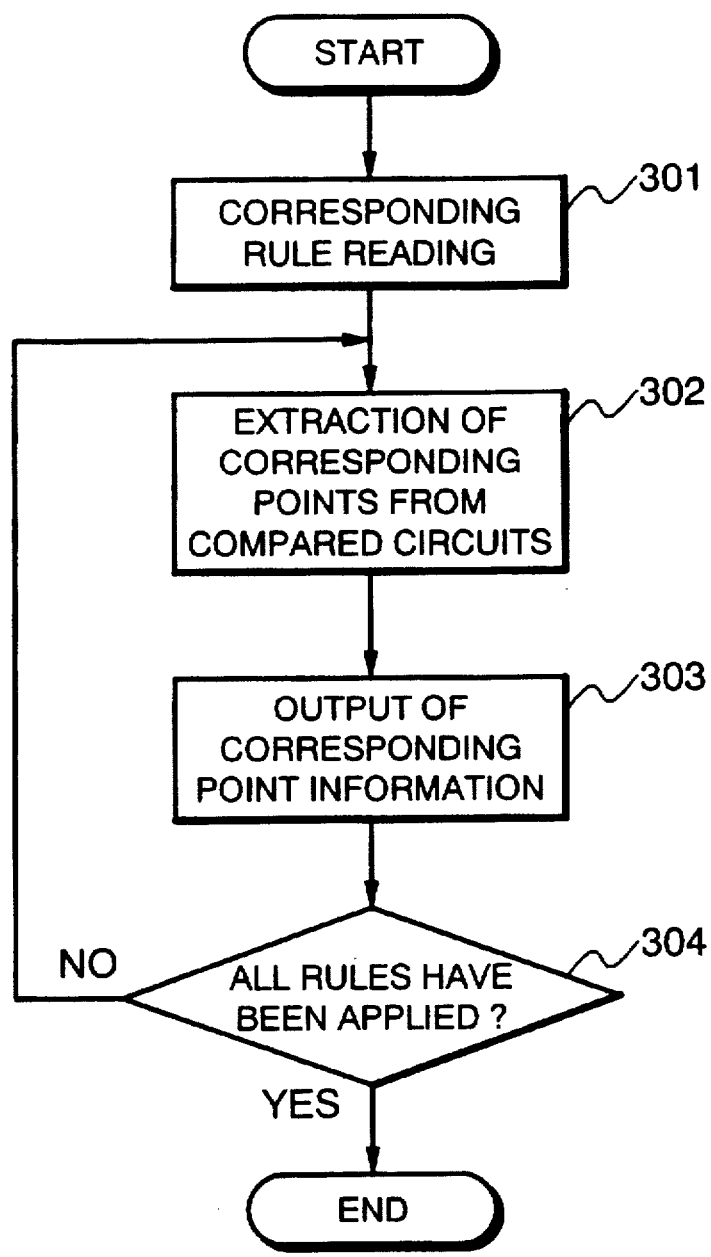
FIG. 3 is a flowchart to illustrate the corresponding point detection algorithm serving for the operation of the corresponding point detection section according to this embodiment.

Referring now to FIG. 3, the corresponding point detection algorithm using corresponding rules is described.

Firstly, the corresponding rules are read from the corresponding rule storage section 107 so that the correspondence rules to be used in the corresponding point detection are interpreted (Step 301). For the correspondence rules used for corresponding point detection, the user may use all of the read correspondence rules or may specify some of the read corresponding rules as required. Then, corresponding points are extracted from the circuit data converted into the intermediate format according to the interpreted correspondence rules (Step 302). Then, the corresponding point information related to the extracted corresponding points are output (Step 303). Whether all of the rules read or specified at Step 301 are applied or not is judged (Step 304) and, if there is any rule which has not been applied yet, the procedure returns to Step 302 to repeat the processing. If all rules have been applied, the processing is terminated.

Figure 4:
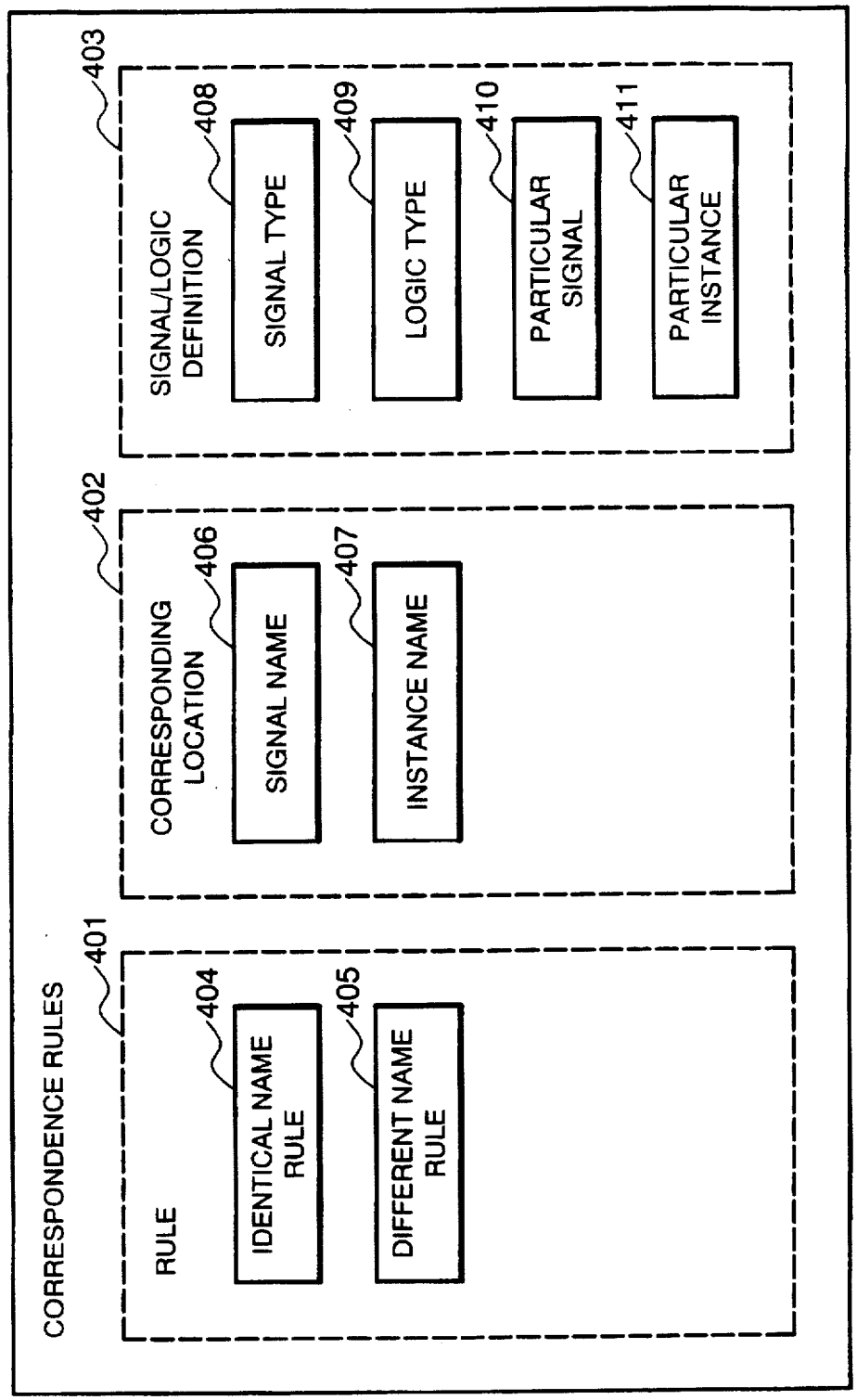
FIG. 4 is a conceptual drawing to show the configuration of the correspondence rules used in this embodiment.

Referring now to FIG. 4, correspondence rules stored in the correspondence rule storage section 107 are described below.

As shown in FIG. 4, a set of correspondence rules comprises, at least, a rule 401 and two types of information including a corresponding location 402 and a signal/logic definition 403. The corresponding location 402 may be specified for each rule 401. The signal/logic definition 403 may be specified for each corresponding location 402. The corresponding location 402 and the signal/logic definition 403 are not fixed and, for example, may be changed after actual detection of corresponding points if required.

The rule 401 comprises an identical name rule 404 according to which the terminals having the same string as the name are judged to be the corresponding points and a different name rule 405 to retrieve corresponding points under certain rules when the terminal names are different character strings. The corresponding location 402 specifies the place to which the rules are applicable. The applicable place may be a signal name (Signal name 406 in FIG. 4) or an instance name (unique name given to a logic) (Instance name 407 in FIG. 4) or may include both of the signal name and the instance name. The signal/logic definition 403 is the information used to define the cases where the rules are applicable. It contains at least a signal type 408, a logic type 409, a particular signal 410 and a particular instance 411. The signal type 408 specifies external and internal terminals of the circuit. The logic type 409 specifies the logic type such as AND, OR and register. The particular signal 410 specifies the signal name. The particular instance 411 specifies the instance name.

Figure 6:
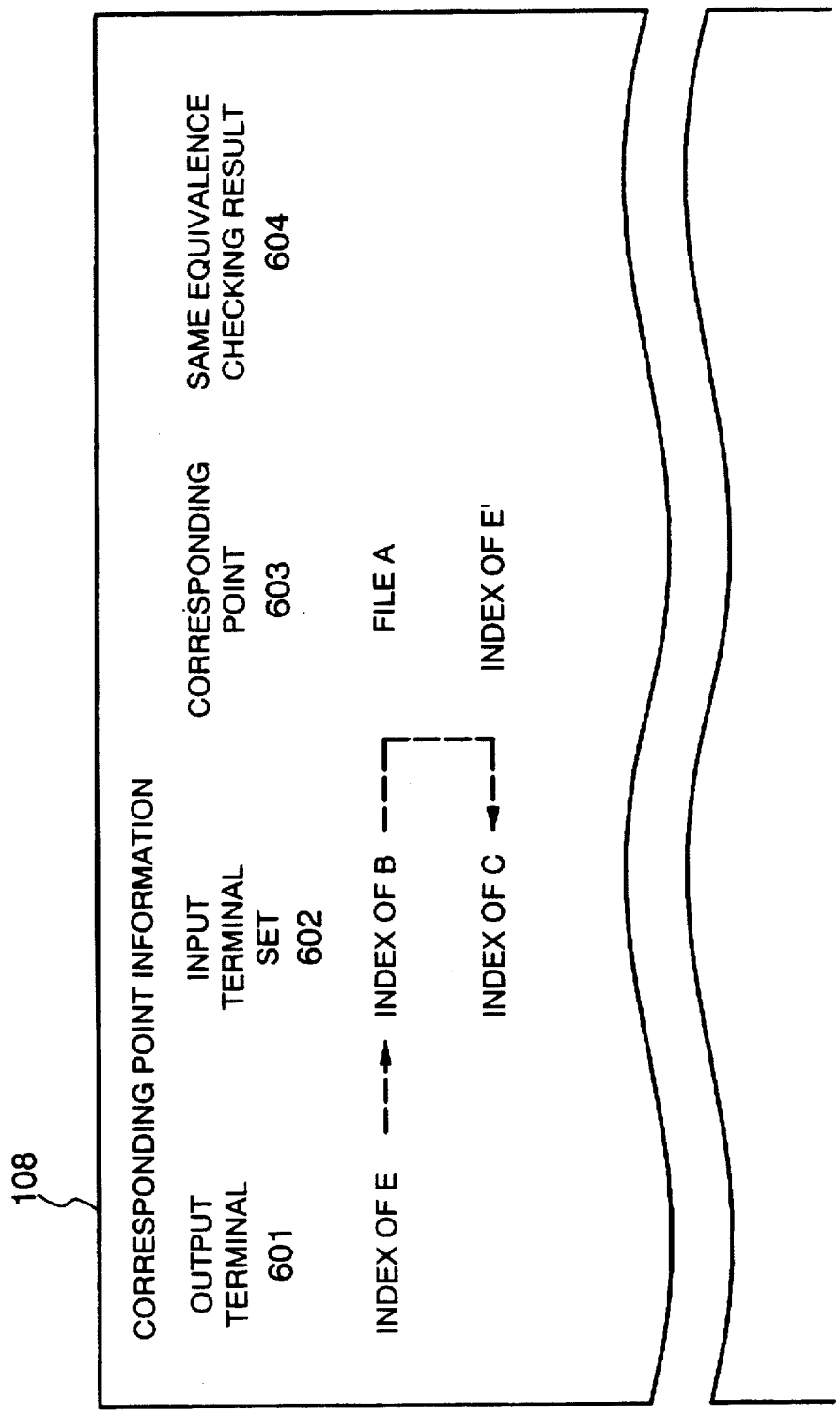
FIG. 6 is a conceptual drawing to show an example of the corresponding point information prepared in this embodiment.

Referring now to FIG. 6, the corresponding point information 108 output from the corresponding point detection section 102 is described in details below.

As shown in FIG. 6, the corresponding point information 108 comprises, at least, an output terminal 601, an input terminal set 602, a corresponding point 603 and a equivalence checking result 604. The output terminal 601 holds a signal serving as the output terminal of a subcircuit when the circuits are partitioned. The input terminal set 602 corresponding to the output terminal 601 holds a signal serving as the signal input of such subcircuit. The corresponding point 603 holds the corresponding point information name of the other circuit to be compared with the output terminal 601 and the output terminal to be compared. The equivalence checking result 604 holds the result of equivalence checking of the two circuits.

The circuit partitioning section 103 reads the data file 106 in the intermediate format output from the data input section 101 and, referring to the corresponding point information 108 prepared by the corresponding point detection section 102, partitions the circuits described in the circuit data according to the intermediate format and prepares subcircuit data 109 (Step 203).

The equivalence checking section 104 compares the data of the corresponding subcircuits among the subcircuit data 109 prepared by the circuit partitioning section 103 and writes the comparison result to the corresponding point information 108. At the equivalence checking section 104, circuits are compared by a verification method using BDD (Binary Decision Diagram) or a verification method with simulation generating test patterns using ATPG (Automatic Test Pattern Generator), for example.

The intermediate format data file 106, the corresponding point information 108 and the subcircuit data 109 prepared by the function performing sections are temporarily stored in a magnetic disk device, semiconductor memory or any other storage device and utilized in the processing by other function performing sections.

In the above configuration, the correspondence rules used by the corresponding point detection algorithms 1 to N stored in the corresponding point detection section 102 may be embedded in the corresponding point detection algorithms 1 to N themselves. In this case, the corresponding point detection algorithms 1 to N have the necessary correspondence rules inside of them from the first and it is not necessary to separately provide a correspondence rule storage section 107.

Figure 2:
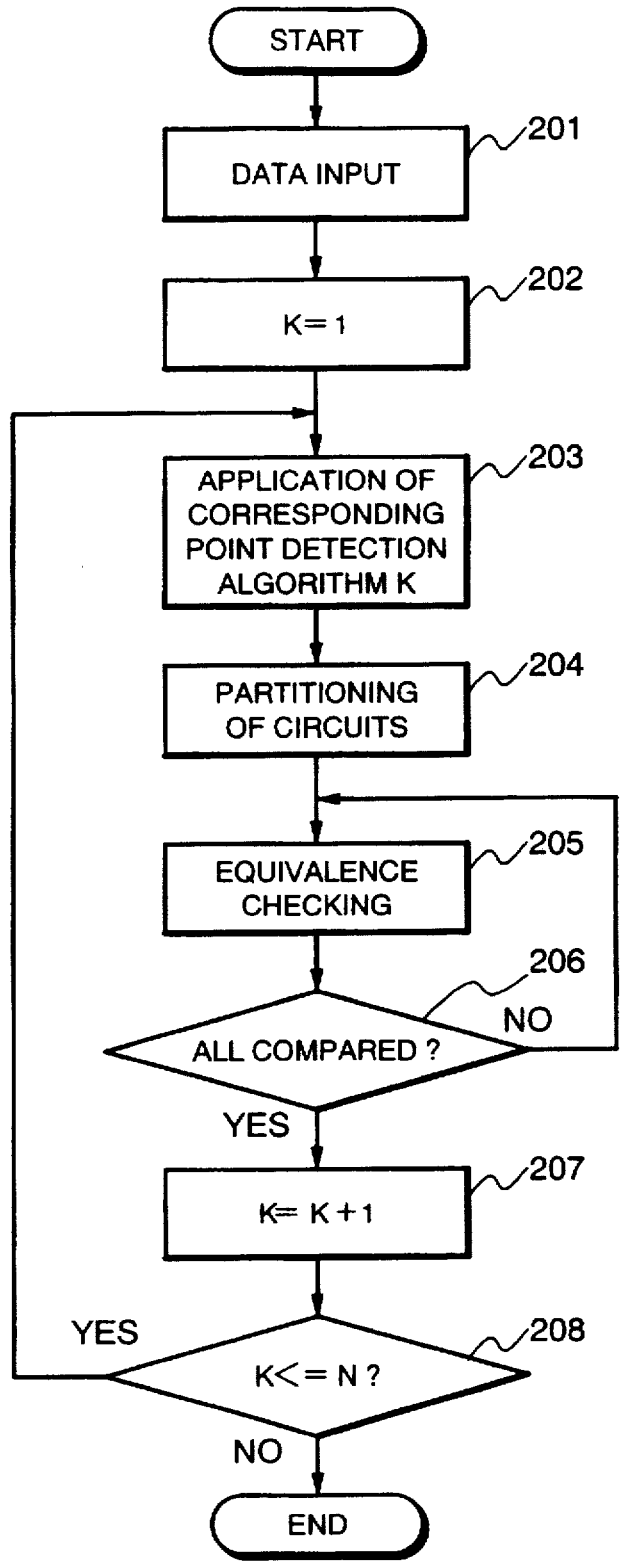
FIG. 2 is a flowchart to illustrate the operation of the logic circuit verification device according to this embodiment.

Next, referring to the flowchart of FIG. 2, the processing and operation in this embodiment are described below.

Firstly, the data input section 101 reads the circuit data 105 (Step 201). If the circuit data 105 uses any macro in the library, the library 110 is read at the same time and the parts using the library in the circuit data 105 are replaced with the applicable logic information read from the library 110. Then, the logic information in the circuit data 105 is extracted, converted into the intermediate format data file 106 and output to the corresponding point detection section 102 and the circuit partitioning section 103.

Next, the corresponding point detection section 102 reads the intermediate format data file 106 output from the data input section 101 and detects the corresponding points using the corresponding point detection algorithm K (=1) among the corresponding point detection algorithms 1 to N in storage so as to prepare corresponding point information 108 (Steps 202, 203). If the corresponding point detection algorithm K uses correspondence rules to find the corresponding points, they are read from the correspondence rule storage section 107.

Then, the circuit partitioning section 103 reads the data file 106 in the intermediate format output from the data input section 101 and, referring to the corresponding point information 108 prepared by the corresponding point detection section 102, partitions the circuits to be verified so as to prepare the subcircuit data 109 (Step 204).

Upon preparation of the subcircuit data 109, the equivalence checking section 104 compares the circuit data of the corresponding subcircuits among the subcircuit data 109 and writes the comparison result to the corresponding point information 108 (Steps 205, 206).

When the equivalence checking section 104 completes equivalence checking of all corresponding subcircuits in the subcircuit data 109 and verification of all parts of the circuits to be verified, the corresponding point detection section 102 checks whether there is any corresponding point detection algorithm K (K=1 to N) which was specified as an algorithm to be used but has not been used yet. The procedure from Step 203 is repeated until it finds no corresponding point detection algorithm K (K=1 to N) which has not been used yet (Steps 207, 208).

Next, the corresponding point detection processing by the corresponding point detection section 102 in this embodiment is described in details with referring to a specific operation example below.

Figure 8:
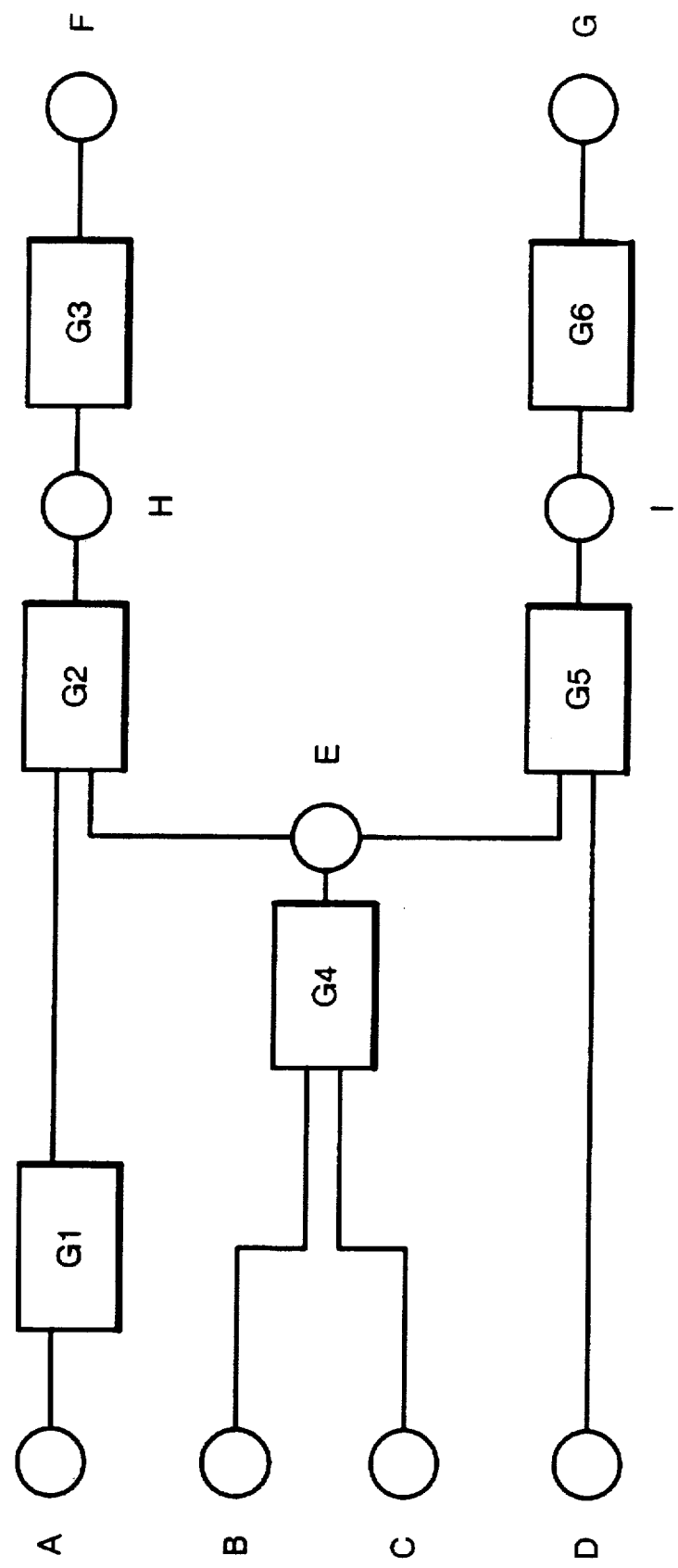
FIG. 8 is a circuit diagram to show a specific example of circuit data used in this embodiment.

FIG. 8 shows the circuit data of the circuits to be verified in this operation example. Firstly, the data input section 101 reads the circuit data 105 as shown in FIG. 8 to prepare the data file 106 in the intermediate format.

Figure 7:
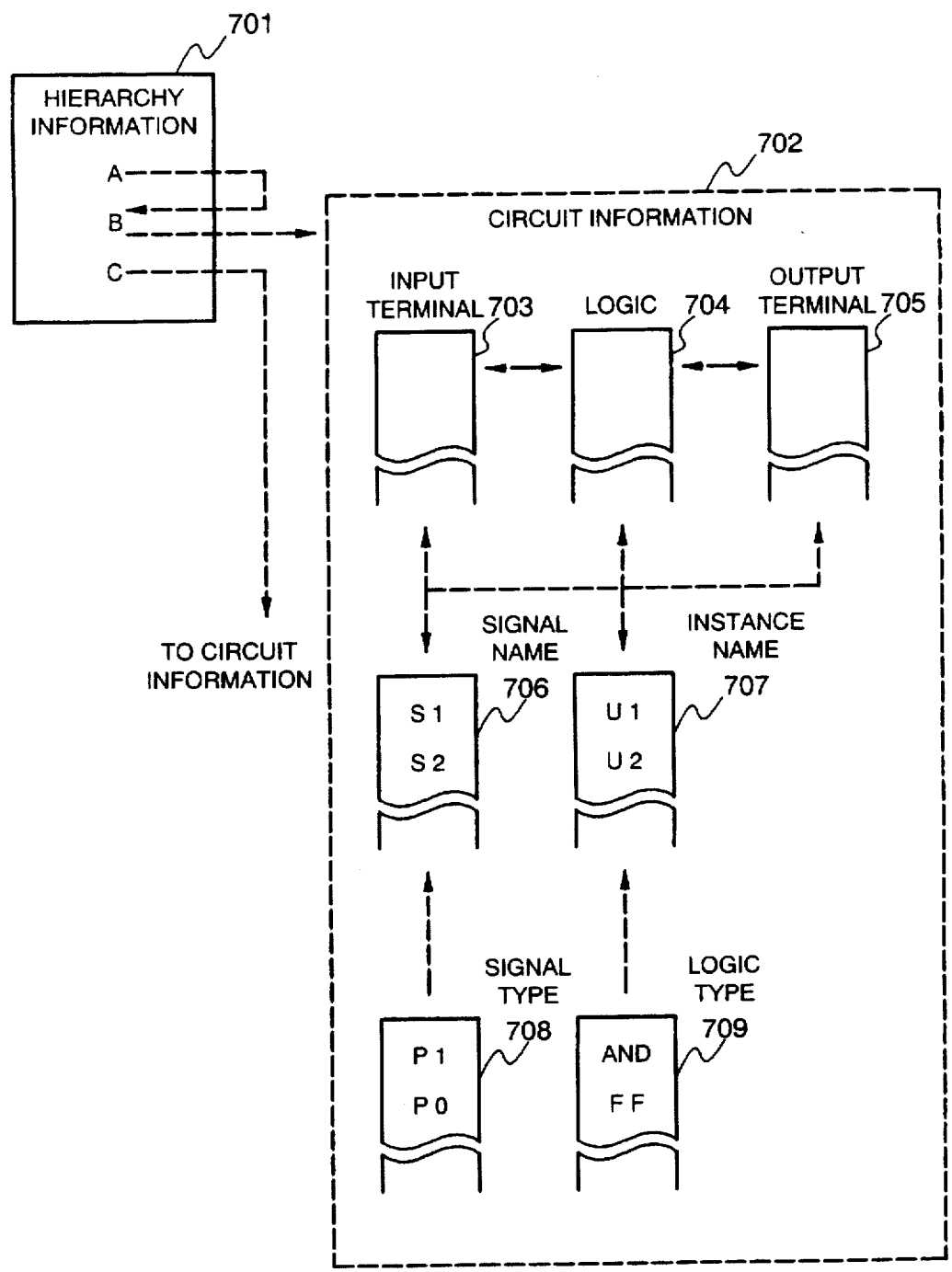
FIG. 7 is a conceptual drawing to show the configuration of a data file in the intermediate format used in this embodiment.

FIG. 7 shows a configuration example of the data file 106 thus prepared. As shown in FIG. 7, the data file 106 comprises hierarchy information 701 and circuit information 702.

In the intermediate format data file 106 as shown in FIG. 7, the hierarchy information 701 shows the hierarchical structure of the circuits to be verified and specifies the circuit information 702 corresponding to each hierarchy level. The logic information of each hierarchy level is stored in the circuit information 702. As shown in FIG. 7, the logic connection relations are expressed by an input terminal 703, a logic 704 and an output terminal 705 in the circuit information 702. In addition, a signal name 706 and a signal type 708 are stored as detailed information of the input terminal 703 and the output terminal 705 and an instance name 707 and a logic type 709 are stored as detailed information of the logic 704.

Names of the input terminal 703 and the output terminal 705 are obtained from the signal name 706. An instance name added to the logic 704 is obtained from the instance name 707. The signal type 708 specifies the applicable name for each type. Therefore, from the signal type 708, the signal name 706 can be learned and the input terminal 703 and the output terminal 705 can be also learned. Besides, since the logic type 709 specifies the applicable instance name for each type, the instance name 707 and then the logic 704 can be learned from the logic type 709.

By using the signal name 706, the instance name 707, the signal type 708 and the logic type 709, the signal or the logic can be efficiently retrieved from the corresponding location 402 or signal/logic definition 403 as set forth in the correspondence rules.

The corresponding point detection section 102 reads the intermediate format data file 106 prepared by the data input section 101 and the correspondence rules stored in the correspondence rule storage section 107 to detect the corresponding points and outputs the detection results as the corresponding point information 108.

Figure 5:
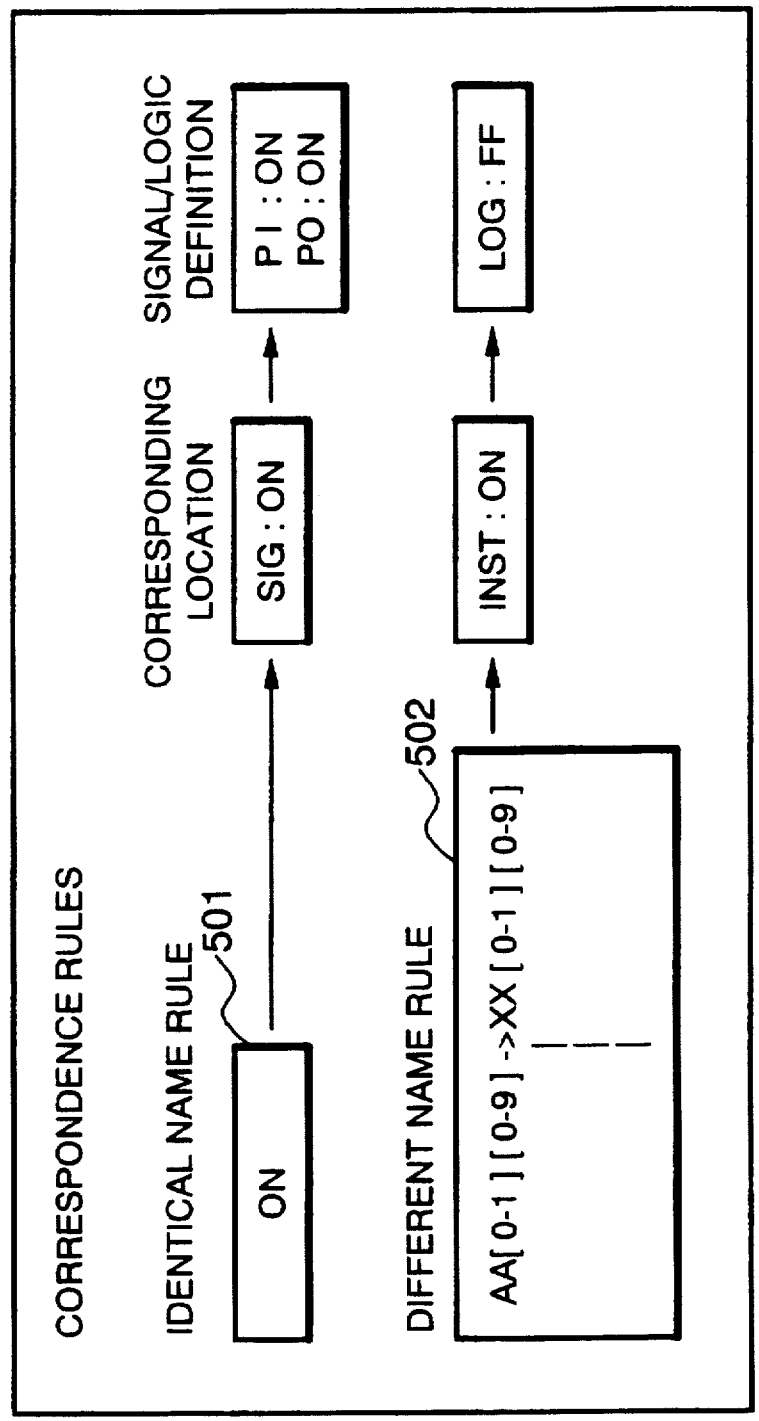
FIG. 5 is a conceptual drawing to show a specific example of the correspondence rules used in this embodiment.

FIG. 5 shows an example of correspondence rules stored in the correspondence rule storage section 107. According to the correspondence rules in FIG. 5, an identical name rule 501 shows the condition that the external input/output terminals having the same name are all considered to be corresponding points. A different name rule 502 shows that the logic assigns AA00, AA01, ... AA19 to XX00, XX01, ... XX19 respectively for the register instances.

When using the identical name rule 501 for corresponding point detection algorithms 1 to N, the corresponding point detection section 102 firstly traces the signal name 706 from the primary output of the signal type 708 in the intermediate format data file 106 of FIG. 7, and then traces the output terminal 705 from the signal name 706 and writes the table index of the obtained output terminal 705 to the output terminal 601 of the corresponding point information 108 as shown in FIG. 6. When using the different name rule 502 for corresponding point detection algorithms 1 to N, it firstly traces, in the intermediate format data file 106 as shown in FIG. 7, the instance name 707 from the logic type 709, and traces the logic 704 from the instance name 707 and then traces the output terminal 705 from the logic 704, and finally writes the table index of the obtained output terminal 705 to the output terminal 601 of the corresponding point information 108 as shown in FIG. 6. In the example of FIG. 6, the index is written considering the point E in the circuit of FIG. 8 as the output terminal.

Then, the corresponding point detection section 102 writes the corresponding point information filename of the compared circuits and the table index of the output terminal 601 to the corresponding point 603 of the corresponding point information 108 as shown in FIG. 6. After applying all correspondence rules, it continues retrieval in the input direction from the signal stored in the output terminal 601 until it reaches an primary input or the signal stored in another output terminal 601 and writes the input signal of the end point to the input terminal set 602 in the corresponding point information 108. In the example of FIG. 6, the points B and C in the circuit shown in FIG. 8 are considered as the input terminal set for index writing.

The corresponding point information 108 thus prepared is read by the circuit partitioning section 103. The circuit partitioning section 103 makes use of the information read at the output terminal 601 and at the input terminal set 602 in the corresponding point information 108 to partition the circuits and prepare the subcircuit data 109. The equivalence checking section 104 reads the prepared subcircuit data 109 and comparatively verifies the subcircuits using a conventional verification method as described above.

Finally, the equivalence checking section 104 writes the verification result to the equivalence checking result 604 in the corresponding point information 108 as shown in FIG. 6.

Figure 9A:
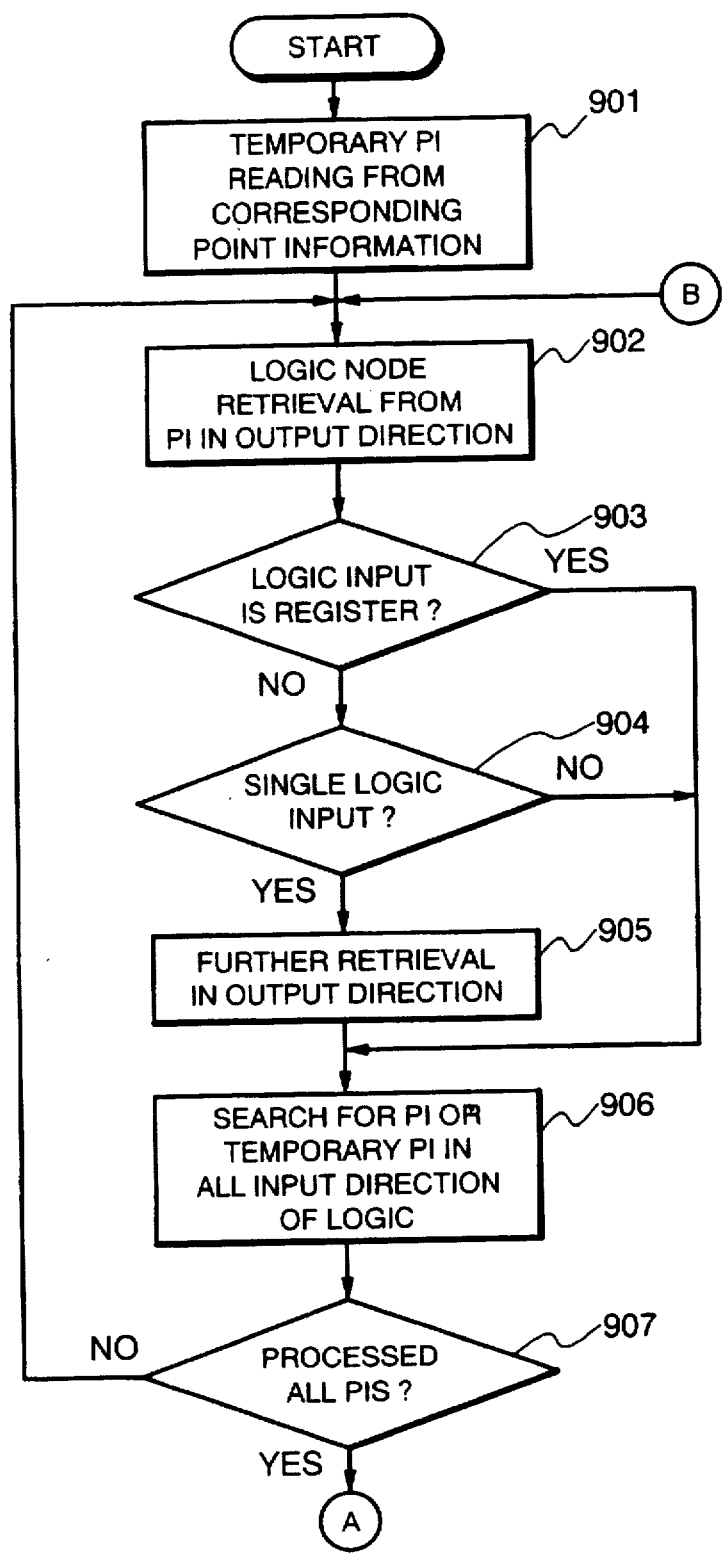
FIG. 9A is a flowchart to illustrate the corresponding point detection algorithm serving for the operation of the corresponding point detection section and a drawing to show the correspondence point detection operation according to another embodiment of the present invention.
Figure 9B:
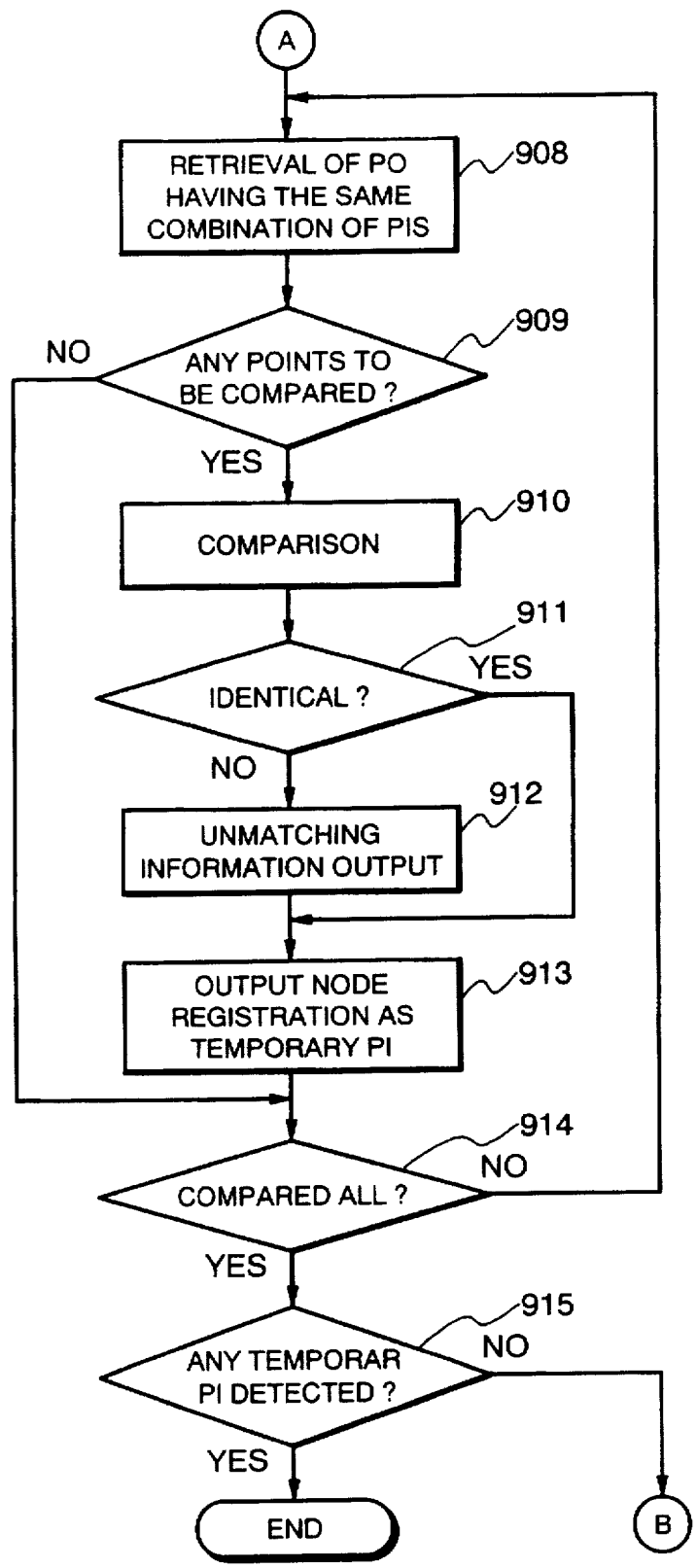
FIG. 9B is a flowchart to illustrate the corresponding point detection algorithm serving for the operation of the corresponding point detection section and a drawing showing the inspection operation to check whether the detected corresponding point is appropriate or not according to another embodiment of the present invention.
Figure 10:
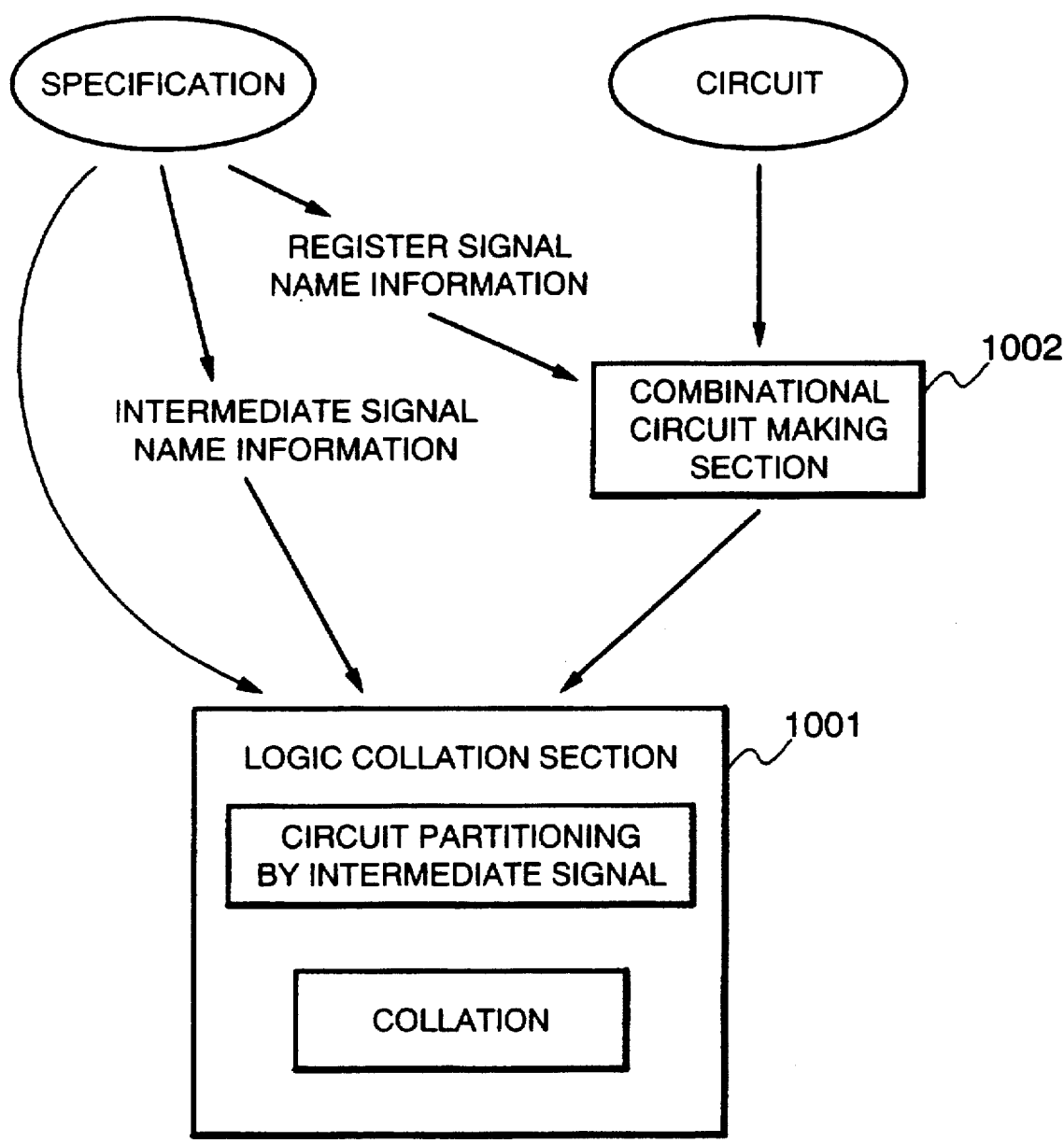
FIG. 10 is a system configuration drawing to show the configuration of a system to realize the conventional logic circuit verification method.

FIGS. 9A and 9B show a flowchart illustrating the corresponding point detection algorithm according to another embodiment of the present invention.

The logic circuit verification device in this embodiment has the same configuration as the logic verification device according to the first embodiment as in FIG. 1. The corresponding point detection algorithms in this embodiment are, similarly to the first embodiment, stored in the corresponding point detection section 102 and used for detection of corresponding points in the circuits to be verified. The corresponding point detection algorithm in this embodiment detects corresponding points considering the circuit configuration of the circuits to be verified.

Referring to FIGS. 9A and 9B, the primary input of the compared circuit data (PI) and the output terminal stored in the corresponding point information having the same comparative detection result (Temporary PI) are read first (Step 901). If no temporary PI is stored in the corresponding point information, the temporary PI is obtained by retrieval from PI according to the procedure below. When several temporary PIs are stored in the corresponding point information but are not sufficient for corresponding points of the circuit data in question, the temporary PIs stored in the corresponding point information are used as they are and temporary PIs are further obtained by retrieval according to the procedure below for insufficient corresponding points.

Then, logic nodes are retrieved from PI and temporary PI in the output direction of the circuit (Step 902). A logic node here means an output terminal for logic such as AND or OR.

If the logic node retrieval reaches a register, the retrieval is completed there (Step 903). If not, the input terminal for logic nodes is referred to. If there is only one input terminal, logic nodes are further retrieved in the output direction (Steps 904, 905). On the other hand, if there are several input terminals, the retrieval is terminated in principle (Step 904). Even when there are several input terminals, if the input terminals except one have a signal value fixed at "0" or "1", for example, the retrieval in the output direction is continued.

Then, the retrieval is made from the output terminal of the reached logic node (Temporary PO) in the input direction of the circuit until a PI or a temporary PI is reached (Step 906). Then, the temporary PO is written to the output terminal 601 in the corresponding point information 108 as shown in FIG. 6 and the combination of temporary PIs is written to the input terminal set 602 in the corresponding point information 108.

The above procedure until Step 906 is repeated until all PIs and temporary PIs are processed (Step 907). This procedure is similarly executed for the other circuit to be compared.

Then, the circuit to be compared is searched for identical combination of PI and temporary PI in relation to a temporary PO so that it is subjected to comparison (Steps 908 to 910). When the comparison result is not identical, the unmatching notice is output to the user (Steps 911, 912).

Then, the temporary PO after comparison is registered as the temporary PI of the corresponding point information (Step 913). All processes from Step 908 to Step 913 above are executed for all temporary POs (Step 914). After verification of all temporary POs, it is checked whether a new temporary PI has been generated. If there is a temporary PI, the procedure is repeated from Step 902 (Step 915).

Next, the corresponding point detection processing according to this embodiment is described in further details below with referring to a specific operation example. The circuit for corresponding point detection in this embodiment is supposed to have the circuit data as shown in FIG. 8.

The corresponding point detection section 102 firstly reads the corresponding point information 108. Suppose here that, in the circuit data of FIG. 8, terminal E is held at the output terminal 601 in the corresponding point information 108 of FIG. 6 and the equivalence checking result 604 holds the information indicating that the equivalence checking results to be identical. In this case, this terminal E can be considered a temporary PI.

Next, in the intermediate format data file 106 of FIG. 7, the signal name 706 is traced from the signal type 708 and the input terminal 703 is further traced. As a result, primary inputs A, B, C and D shown in the circuit data of FIG. 8 are considered PIs.

Then, with taking "A", which is one of the PIs, logic nodes are retrieved in the output direction and "G1" is reached. Since "G1" has a single input terminal, retrieval of logic nodes in the output direction is continued and reaches another logic node "G2". As shown in FIG. 8, "G2" has two input terminals and the logic node retrieval is terminated here. The output terminal "H" of "G2" is treated as a temporary PO.

Then, PI or temporary PI is retrieved in the input direction from "G2" so that "E" is reached. Since "E" is a temporary PI, the retrieval is terminated here. Then, "H" is written to the output terminal 601 in the corresponding point information 108 of FIG. 6 and "A" and "E" to the input terminal set 602. Since "B" and "C" are already registered to the input terminal set 602 in the corresponding point information 108, they are left unprocessed and retrieval is executed for the remaining PI "D". Then, "I" is written to the output terminal 601 in the corresponding point information 108 of FIG. 6 and "D" and "E" are written to the input terminal set 602.

The above procedure is similarly executed for other circuits to be compared. Then, from the obtained corresponding point information 108, the circuits having the same input terminal set 602 are selected and partitioned by the circuit partitioning section 103. In this embodiment, subcircuits having "H" and "I" as the output terminals are generated.

After that, the equivalence checking section 104 executes equivalence checking. Suppose here that a subcircuit having "H" and "I" as output terminals and another subcircuit to be compared with the above subcircuit are found and that they have the same verification result. In this case, "H" and "I" are treated as temporary PIs. Then, "H" and "I" now serving as temporary PIs are processed again.

Firstly, logic nodes are retrieved from "H" in the output direction and "G3" is reached. "G3" has a single input terminal but its output terminal "F" is an external terminal, and the retrieval is terminated here. Then, "F" is written to the output terminal 601 in the corresponding point information 108 of FIG. 6 and "H" to the input terminal set 602.

The same processing is executed for "I". "G" is written to the output terminal 601 in the corresponding point information 108 and "I" to the input terminal set 602.

The above processing is similarly executed for other circuits to be compared. Then, from the obtained corresponding point information 108, the circuits having the same input terminal set 602 are selected and partitioned by the circuit partitioning section 103. Then, the equivalence checking section 104 executes equivalence checking.

If, in the equivalence checking by the equivalence checking section 104 for a subcircuit having "H" and "T" as output terminals and the other circuit compared with such subcircuit, the verification results for the output terminal "T" is not identical, it is judged inappropriate to have treated "T" as a corresponding point. In this case, the processing to find corresponding points is executed again.

Specifically, logic nodes are retrieved in the output direction for the corresponding point "T", and "G" as the output of "G6" is reached. Then, "G" is written to the output terminal 601 in the corresponding point information 108 of FIG. 6 and "E" and "D" to the input terminal set 602. After that, the equivalence checking section 104 executes equivalence checking and writes the verification results to the equivalence checking result 604.

As described above, with a logic circuit verification device and a method therefor according to the present invention, the subcircuits to be compared can be automatically specified considering the circuit configuration even when the register or other signal names are different. Thus, the process where the user specifies the signal names to be compared can be omitted and the logic verification process can be executed more efficiently than before.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A logic circuit verification device for partitioning of logic circuits into subcircuits and equivalence checking of such subcircuits, comprising:

conversion means for reading circuit data and circuit information of the logic circuits to be verified and converting the circuit data of said logic circuits into an intermediate format independent from technology;

corresponding point detection means for reading the intermediate format data converted by said conversion means and extracting the information concerning the corresponding points, which are the positions for partitioning said logic circuits to be verified into subcircuits and for associating the subcircuits to be compared using one or more corresponding point detection algorithm prepared according to the type and configuration of the verified logic circuits and to output such extracted data as the corresponding point information;

circuit partitioning means for reading the intermediate format data converted by said conversion means and, according to the corresponding point information obtained by said corresponding point detection means, partitioning said logic circuits to prepare the circuit data of the subcircuits; and equivalence checking means for reading the circuit data of said subcircuits prepared by said circuit partitioning means, and determining the subcircuits to be compared with referring to the corresponding point information obtained by said corresponding point detection means and comparatively verifying the circuit data of said subcircuits.

2. A logic circuit verification device as set forth in claim 1, wherein said corresponding point detection means obtains said corresponding point information using a rule to consider the points with the same signal name or logic name to be corresponding points or another rule to retrieve corresponding points under certain scheme when the signal names or logic names are different as required.

3. A logic circuit verification device as set forth in claim 1, wherein the user arbitrarily specifies said corresponding point detection algorithm to be used by said corresponding point detection means depending on the type and configuration of the logic circuits to be verified for individual logic circuit verifications.

4. A logic circuit verification device as set forth in claim 1, wherein said corresponding point detection means records at least the information concerning the output terminal serving as the terminal in circuit partitioning, the information concerning the input terminal set corresponding to said output terminal, and the information to specify the compared output terminal in the corresponding point information storage means of the other circuit to be compared with said output terminal to the file of said corresponding point information and said equivalence checking means records said equivalence checking result to the file of said corresponding point information corresponding to said equivalence checking result.

5. A logic circuit verification device as set forth in claim 1, wherein said corresponding point detection means executing, retrieval of logic nodes in the output direction for the primary input of said circuit to be verified from said primary input when there is no corresponding point information about the circuit data of the logic circuit to be verified and, when there already exists corresponding point information about the circuit data of the logic circuit to be verified, retrieval of logic nodes in the output direction for the primary input of said circuit to be verified and those judged to have the same equivalence checking result among the output terminals contained in said corresponding point information from said primary input and said output terminal recorded in the corresponding point information and, when several input terminals or a register are reached in said retrieval, retrieval of said primary input or said output terminal recorded in said corresponding point information in the input direction from the output terminal of the reached logic node, and detection of the parts in the circuit data having the same combination of said primary input and said output terminal recorded in said corresponding point information for the same output terminal of said logic node among the circuit data of all circuits to be verified based on the results of above retrievals, and said circuit partitioning means preparing circuit data of the subcircuits by partitioning parts of the circuit data detected by said corresponding point detection means from other parts.

6. A logic circuit verification method containing the following steps executed in a logic circuit verification device for partitioning of logic circuits into subcircuits and equivalence checking of such subcircuits, comprising the steps of:

a step of reading the circuit data and circuit information of the logic circuits to be verified and converting the circuit data of said logic circuits into an intermediate format independent from technology;

a step of reading the intermediate format data converted by said conversion step and extracting the information concerning the corresponding points, which are the positions for partitioning said logic circuits to be verified into subcircuits and for associating the subcircuits to be compared using one or more corresponding point detection algorithm prepared according to the type and configuration of the verified logic circuits and to output such extracted data as the corresponding point information;

a step of reading the intermediate format data converted by said conversion step and, according to the corresponding point information obtained by said corresponding point detection step, partitioning said logic circuits to prepare the circuit data of the subcircuits; and a step of reading the circuit data of said subcircuits prepared by said circuit partitioning step, determining the subcircuits to be compared with referring to the corresponding point information obtained by said corresponding point detection step and comparatively verifying the circuit data of said subcircuits.

7. A logic circuit detection method as set forth in claim 6, wherein said corresponding point detection step further comprising:

a step of extracting said corresponding point information using a rule to consider the points with the same signal name or logic name to be corresponding points or another rule to retrieve corresponding points under certain scheme when the signal names or logic names are different as required;

a step of recording the extracted corresponding point information to a certain file; and a step of judging whether all of said rules have been used for retrieval of corresponding points and, if any of said rules has not been used yet, returning the processing to said corresponding point information extraction step.

8. A logic circuit detection method as set forth in claim 6 wherein said corresponding point detection step further comprising:

a step of retrieving logic nodes in the output direction for the primary input of said circuit to be verified from said primary input when there is no corresponding point information about the circuit data of the logic circuit to be verified and retrieving, when there already exists corresponding point information about the circuit data of the logic circuit to be verified, logic nodes in the output direction for the primary input of said circuit to be verified and those judged to have the same equivalence checking result among the output terminals contained in said corresponding point information from said primary input and said output terminal recorded in the corresponding point information;

a step of retrieving, when several input terminals or a register are reached in said retrieval, said primary input or said output terminal recorded in said corresponding point information in the input direction from the output terminal of the reached logic node; and a step of detecting the parts in the circuit data having the same combination of said primary input and said output terminal recorded in said corresponding point information for the same output terminal of said logic node among the circuit data of all circuits to be verified based on the results of above retrievals;

wherein said circuit partitioning step preparing circuit data of the subcircuits by partitioning parts of the circuit data detected by said corresponding point detection means from other parts.

9. A computer readable memory storing a control program to control a logic circuit verification device for partitioning of logic circuits into subcircuits and equivalence checking of such subcircuits, said control program comprising:

a step of reading the circuit data and circuit information of the logic circuits to be verified and converting the circuit data of said logic circuits into an intermediate format independent from technology;

a step of reading the intermediate format data converted by said conversion step and extracting the information concerning the corresponding points, which are the positions for partitioning said logic circuits to be verified into subcircuits and for associating the subcircuits to be compared using one or more corresponding point detection algorithm prepared according to the type and configuration of the verified logic circuits and to output such extracted data as the corresponding point information;

a step of reading the intermediate format data converted by said conversion step and, according to the corresponding point information obtained by said corresponding point detection step, partitioning said logic circuits to prepare the circuit data of the subcircuits; and a step of reading the circuit data of said subcircuits prepared by said circuit partitioning step, determining the subcircuits to be compared with referring to the corresponding point information obtained by said corresponding point detection step and comparatively verifying the circuit data of said subcircuits.

10. A computer readable memory as set forth in claim 9 wherein said corresponding point detection step of said control program further comprising:

a step of extracting said corresponding point information using a rule to consider the points with the same signal name or logic name to be corresponding points or another rule to retrieve corresponding points under certain scheme when the signal names or logic names are different as required;

a step of recording the extracted corresponding point information to a certain file; and a step of judging whether all of said rules have been used for retrieval of corresponding points and, if any of said rules has not been used yet, returning the processing to said corresponding point information extraction step.

11. A computer readable memory as set forth in claim 9 wherein said corresponding point detection step of said control program further comprising:

a step of retrieving logic nodes in the output direction for the primary input of said circuit to be verified from said primary input when there is no corresponding point information about the circuit data of the logic circuit to be verified and retrieveing, when there already exists corresponding point information about the circuit data of the logic circuit to be verified, logic nodes in the output direction for the primary input of said circuit to be verified and those judged to have the same equivalence checking result among the output terminals contained in said corresponding point information from said primary input and said output terminal recorded in the corresponding point information and, a step of retrieving, when several input terminals or a register are reached in said retrieval, said primary input or said output terminal recorded in said corresponding point information in the input direction from the output terminal of the reached logic node, and a step of detecting the parts in the circuit data having the same combination of said primary input and said output terminal recorded in said corresponding point information for the same output terminal of said logic node among the circuit data of all circuits to be verified based on the results of above retrievals, wherein said circuit partitioning step preparing circuit data of the subcircuits by partitioning parts of the circuit data detected by said corresponding point detection means from other parts.

* * * * *